United States Patent [19]
Leas

[11] Patent Number: 6,037,210
[45] Date of Patent: *Mar. 14, 2000

[54] MEMORY CELL WITH TRANSFER DEVICE NODE IN SELECTIVE POLYSILICON

[75] Inventor: James M. Leas, South Burlington, Vt.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/049,947

[22] Filed: Mar. 30, 1998

Related U.S. Application Data

[62] Division of application No. 08/951,554, Oct. 16, 1997.

[51] Int. Cl.⁷ .................................... H01L 21/8242
[52] U.S. Cl. .......................... 438/245; 438/246; 438/247; 438/248; 438/249; 257/301; 257/305
[58] Field of Search ................................ 438/245, 246, 438/248, 249, 243, 386; 257/301, 305

[56] References Cited

U.S. PATENT DOCUMENTS

| | | | |
|---|---|---|---|
| 4,396,933 | 8/1983 | Magdo et al. | 357/50 |
| 4,649,625 | 3/1987 | Lu | 438/245 |
| 4,794,434 | 12/1988 | Pelley, III | 257/301 |
| 4,801,988 | 1/1989 | Kenney | 257/304 |
| 4,833,516 | 5/1989 | Hwang et al. | 257/302 |
| 4,927,779 | 5/1990 | Dhong et al. | 438/153 |
| 4,942,554 | 7/1990 | Kircher et al. | 365/149 |
| 4,988,637 | 1/1991 | Dhong et al. | 438/245 |
| 5,055,898 | 10/1991 | Beilstein, Jr. et al. | 257/301 |
| 5,064,777 | 11/1991 | Dhong et al. | 438/242 |
| 5,156,992 | 10/1992 | Teng et al. | 438/246 |
| 5,214,603 | 5/1993 | Dhong et al. | 365/207 |
| 5,250,829 | 10/1993 | Bronner et al. | 257/301 |
| 5,360,758 | 11/1994 | Bronner et al. | 438/243 |
| 5,428,236 | 6/1995 | Uchida | 257/305 |
| 5,442,211 | 8/1995 | Kita | 257/301 |
| 5,543,348 | 8/1996 | Hammerl et al. | 437/60 |
| 5,555,520 | 9/1996 | Sudo et al. | 257/301 |
| 5,563,085 | 10/1996 | Kohyama | 437/47 |
| 5,563,433 | 10/1996 | Nagata et al. | 257/301 |
| 5,869,868 | 2/1999 | Rajeevakumar | 257/350 |
| 5,909,044 | 6/1999 | Chakravarti et al. | 257/301 |

OTHER PUBLICATIONS

S. Wolf and R.N. Tauber, Silicon Processing for the VLSI Era, vol. 1, Lattice Press, pp. 261 and 262, 1986.

Process Scheme to Make Shallow Trench Isolation Self–Aligned to the Storage Trench, IBM Technical Disclosure Bulletin; vol. 33, No. 10A, Mar., 1991; pp. 260–262.

Three–Dimensional Single–Crystal Dynamic RAM Cell; IBM Technical Disclosure Bulletin; vol. 31, No. 12, May, 1989; pp. 302–305.

Fabrication Method to Offset the Self–Aligned Vertical Connection Over the Trench Capacitor; IBM Technical Disclosure Bulletin; vol. 32, No. 3B, Aug. 1989; pp. 163–168.

New Process and Layout Enhancement of the SSPT Cell from an Open Bitline to a Folded Bitline Structure; IBM Technical Disclosure Bulletin; vol. 32, No. 3B, Aug. 1989; pp. 169–174.

Vertical Conducting Connection to a Poly–Si Trench in Si; IBM Technical Disclosure Bulletin; vol. 31, No. May 12, 1989; pp. 310–312.

Flanged Trench Capacitor Cell; IBM Technical Disclosure Bulletin; vol. 30 No. 5, Oct. 1987; pp. 410–411.

*Primary Examiner*—Donald L. Monin, Jr.
*Assistant Examiner*—Hoai Pham
*Attorney, Agent, or Firm*—Whitham, Curtis & Whitham; James M. Leas

[57] ABSTRACT

A memory cell is constructed with one electrode of the transfer device extending over a trench capacitor, saving about 6.5% of cell area. Selective polysilicon for a strap seeded from the trench is grown in the same step in which selective single crystal silicon seeded from the substrate is grown for the transfer device. At least a portion of the node diffusion is located in single crystal epitaxial silicon extending over the trench. The process eliminates the need for a separate strap masking step.

2 Claims, 5 Drawing Sheets

MEMORY CELL WITH TRANSFER DEVICE NODE IN SELECTIVE POLYSILICON

This application is a divisional of application Ser. No. 08/951,554, filed Oct. 16, 1997.

BACKGROUND OF THE INVENTION

1. Field of the Invention

The present invention generally relates to integrated circuit dynamic random access memories (DRAMs) and, more particularly, to trench capacitor and strap construction in DRAMs.

2. Background Description

Formation of a strap for connection of a DRAM transistor to the storage trench has required difficult process steps, regardless of whether the strap is formed on the surface or buried. In addition, a strap can take space in the cell which limits the minimum cell size.

In an effort to save space, selective silicon has been used to form the transistor in space over the trench seeded from the single crystal substrate. In this case a dielectric cap over the trench is needed to prevent heavily doped trench polysilicon from shorting out the transistor. After the transistor has been formed, a contact is made in the dielectric cap to connect the source of the transistor to the trench polysilicon.

This structure has not actually provided space savings as compared with designs that put the trench in a location that would otherwise be used for isolation. In addition, selective silicon has not provided performance comparable to bulk silicon from the viewpoint of transistor leakage, a key parameter for DRAM performance.

Thus, a better solution is needed that saves space while avoiding a reduction in performance, this solution is provided by the present invention.

SUMMARY OF THE INVENTION

It is therefore an object of the present invention to provide a memory cell in which fabrication of a transfer device node allows for efficient use of space.

It is another object of the invention to provide a memory cell having a transfer device node formed in single crystal silicon located over trench polysilicon.

It is also an object of the invention to provide a simplified method for fabricating a memory cell node contact and strap.

According to the present invention, the transfer device is formed in selective silicon seeded from the substrate and extending over the trench. The source diffusion or node of the device is the only part of the device located above the trench or its collar.

Selective polysilicon seeded from the trench is grown in the same step in which selective single crystal silicon seeded from the substrate is grown for the transfer device.

In one embodiment, a P+ substrate is used without a buried plate. The P+ substrate provides excellent latch up resistance and better maintains the ground voltage level, resisting noise, compared to a P− substrate. However, the lack of buried plate and N well means soft errors could occur due to alpha particles generating minority carriers that diffuse to the node diffusion. In a second embodiment, therefore, the process uses a P− substrate and a buried plate.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
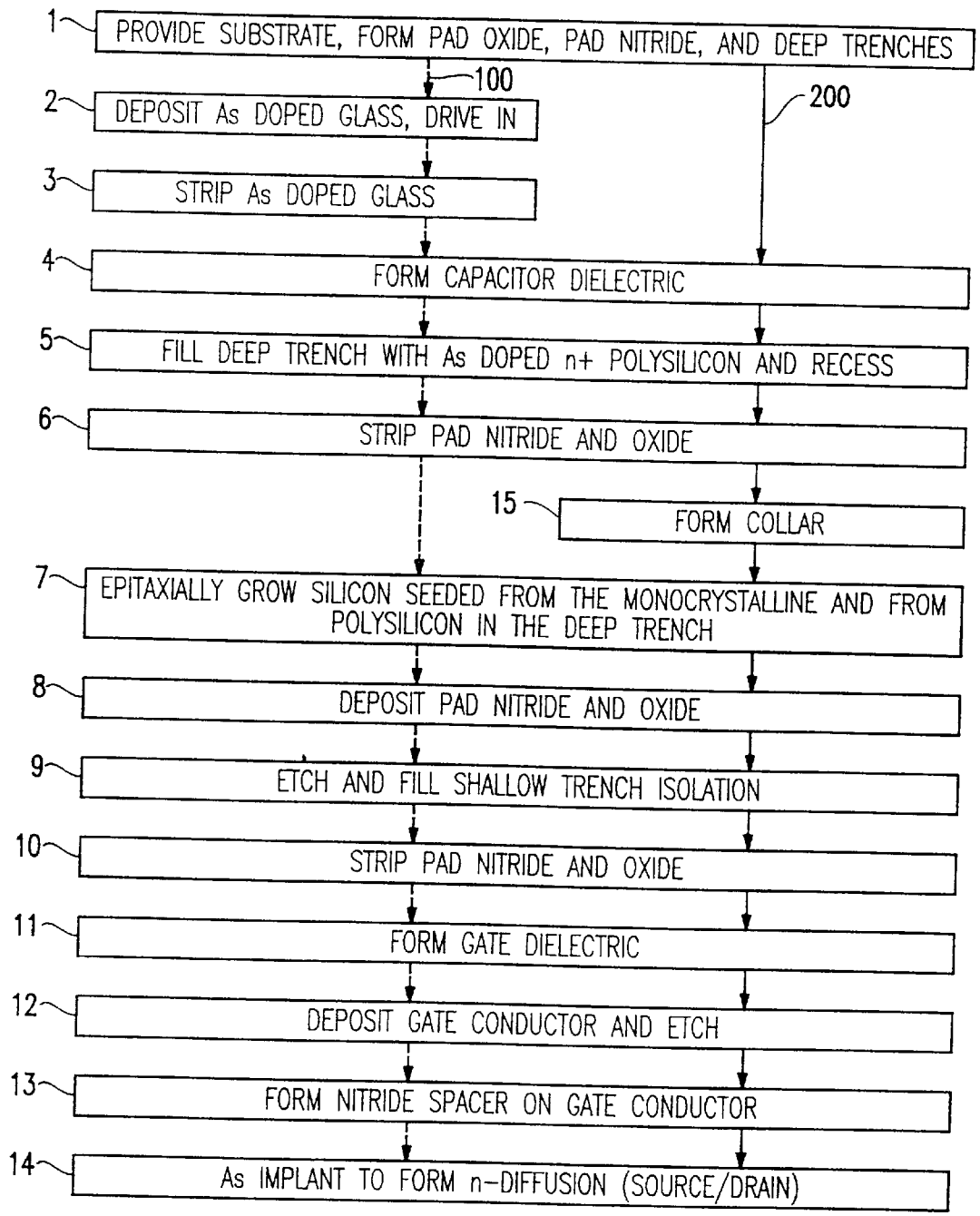
FIG. 1 is a flow chart showing the steps of two embodiments of the present invention.
Figure 2:
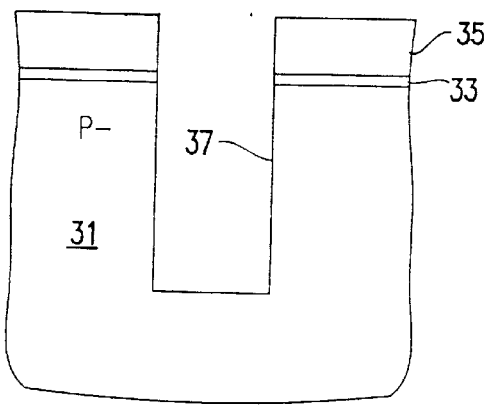
FIGS. 2 through 8 are cross-sectional views of the inventive structure as it is constructed according to one embodiment of the present invention.

Referring now to the drawings, and more particularly to FIG. 1, there is shown a flow chart showing the steps of two embodiments of the present invention. The steps according to the first embodiment will be reviewed first. The order of these steps is represented by the dashed arrow 100. In the step shown in block 1 of FIG. 1 and in the cross-sectional view shown in FIG. 2, a p− substrate 31 is provided, pad oxide 33 is grown, pad nitride 35 deposited and deep trench 37 etched. These steps are accomplished as described in commonly assigned U.S. Pat. No. 5,264,716 (hereinafter referred to as the '716 patent), incorporated herein by reference. Substrate 31 is composed of single crystal silicon. In addition there may be a layer of oxide, such as $SiO_2$ formed from he decomposition of tetraethoxysilane (TEOS), over pad nitride 35.

Figure 3:
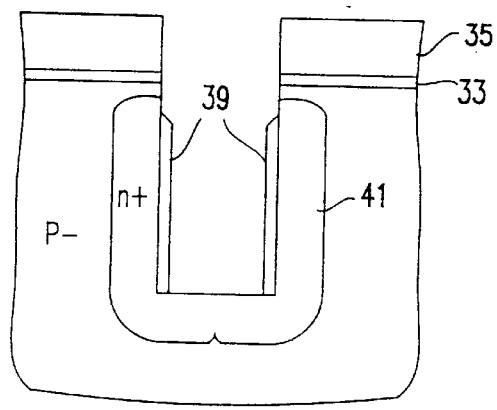
Figure 4:
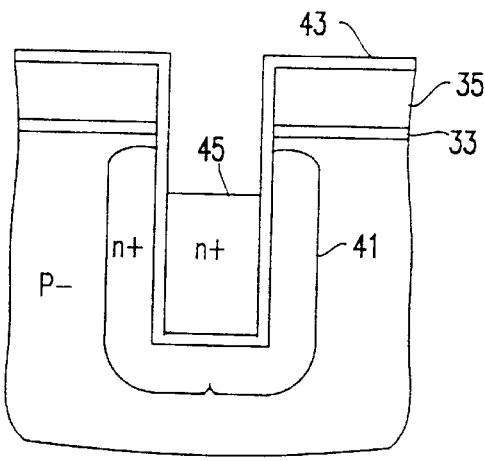

In the step shown in block 2 of FIG. 1 and in the cross-sectional view shown in FIG. 3, arsenic doped glass (ASG) 39 is deposited on deep trench side walls 37 and then spacer etched to recess the ASG about 4000 Å, leaving a p− region at the surface. The recess must be sufficient to provide a spacing between a buried plate formed in the next step and a heavily doped polysilicon strap that will be later formed (as will be seen in FIG. 6). Next, a high temperature drive in step is used to provide an n+ diffusion region 41 around the deep trench 37. Following the drive in step, the ASG is stripped, as shown in the step shown in block 3 of FIG. 1. capacitor dielectric 43 is then formed, as shown in block 4 of FIG. 1 and in the cross sectional view shown in FIG. 4, from a material such as silicon dioxide or from thin layers of dielectrics, such as oxide and then nitride or from a triple layer of oxide, nitride, oxide (ONO) as is known in the art. Next, deep trench 37 is filled with arsenic doped n+ polysilicon 45 and recessed below the surface of substrate 31, as shown in block 5 of FIG. 1.

Figure 5:
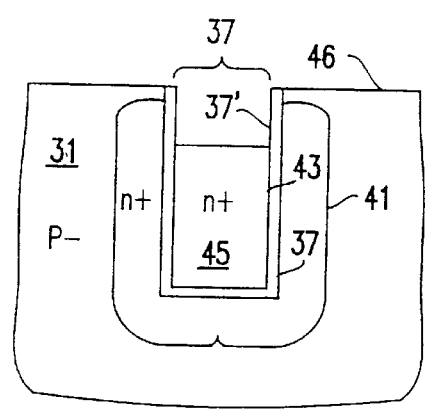

Then, as shown in the step in block 6 of FIG. 1 and in the cross-sectional view shown in FIG. 5, pad nitride 35 and pad oxide 33 are stripped from substrate surface 46 with a directional etch so as to leave capacitor dielectric 43 along top portion 37' or deep trench 37, as well as along sidewalls of deep trench 37 that are protected by n+ polysilicon 45. It is important that dielectric 37' remain extending above buried plate 41 (or that a collar dielectric be deposited and spacer etched) to prevent shorting between n+ polysilicon 45 and buried plate 41 in the following steps.

Figure 6:
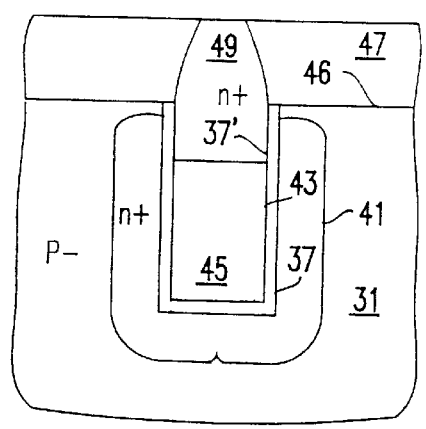

In the next step, as shown in block 7 of FIG. 1 and in the cross-sectional view shown in FIG. 6, single crystal silicon 47 and polysilicon 49 are epitaxtally grown above p–substrate surface 46 and polysilicon 45. Because arsenic diffusivity is orders of magnitude greater in polysilicon than in single crystal silicon, arsenic from polysilicon 45 will diffuse throughout epitaxially grown polysilicon 49, but will not diffuse far into epitaxially grown single crystal silicon 47.

The present invention also takes advantage of the fact that epitaxial silicon grows faster on single crystal silicon than on polysilicon as shown in commonly assigned U.S. Pat. No. 4,396,933, to Magdo et al., incorporated herein by reference. This is illustrated in FIG. 6 where it is seen that as the thickness of epitaxial material 49 and 47 increase, the dimension of single crystal silicon 47 increases faster than the dimension of epitaxial polycrystalline silicon 49. If the epitaxial growth were allowed to proceed longer the surface would eventually only show single crystal silicon (however, this would not be desirable for this application). Thus, p–epitaxial single crystal silicon 47 extends over a portion of n+ polysilicon filled trench 37.

Figure 7:
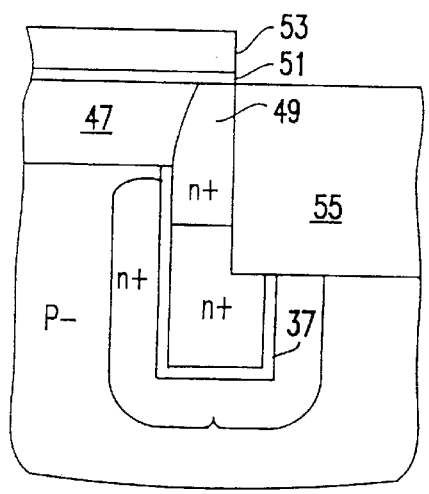

Next, as shown in the step of block 8 of FIG. 1 and in the cross-sectional view shown in FIG. 7, pad nitride 51 and pad oxide 53 are deposited. Then as shown in the step shown in block 9 of FIG. 1 and in th(e cross sectional view shown in FIG. 7, isolation 55 is formed, such as recessed oxide (ROX) or shallow trench isolation (STI). A process for forming STI is described in the '716 patent and in commonly assigned U.S. Pat. No. 5,173,439, incorporated herein by reference. Shallow trench isolation 55, has been formed, cutting through epitaxially grown single crystal silicon 47 and polysilicon 49 and into the deep trench arsenic doped polysilicon 45 and n+ diffusion region 41.

Figure 8:
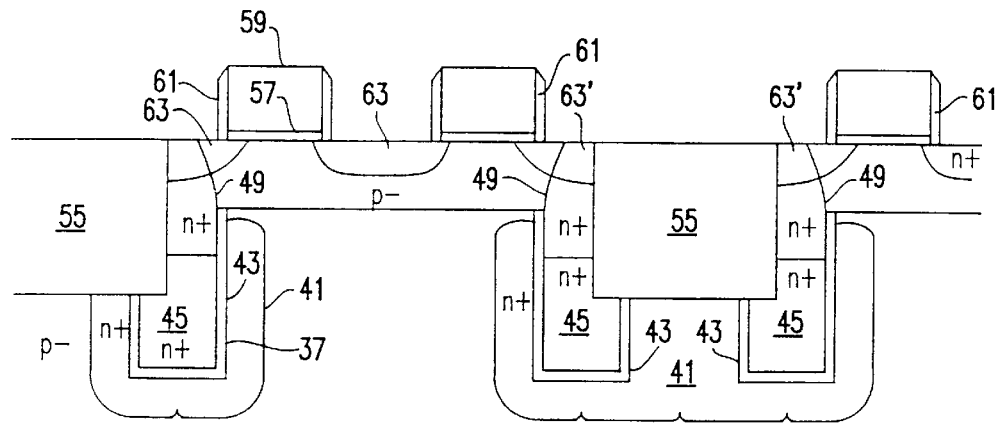
Figure 9:
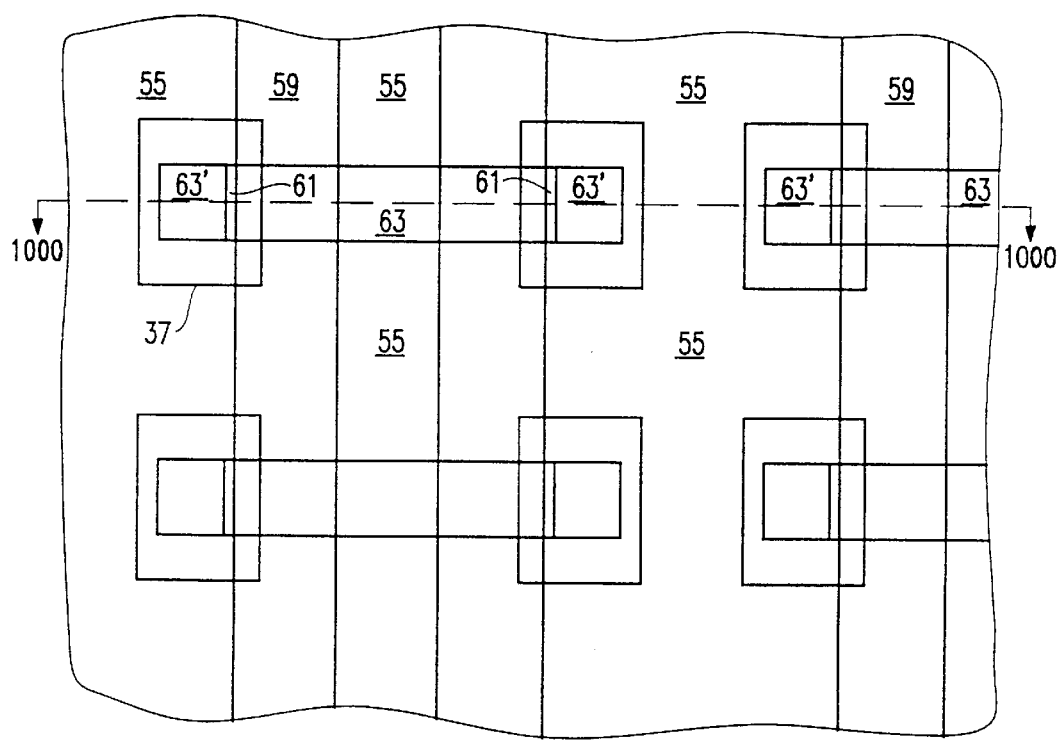
FIG. 9 is a top down view of the inventive structure as it is constructed according to one embodiment of the present invention.
Figure 10:
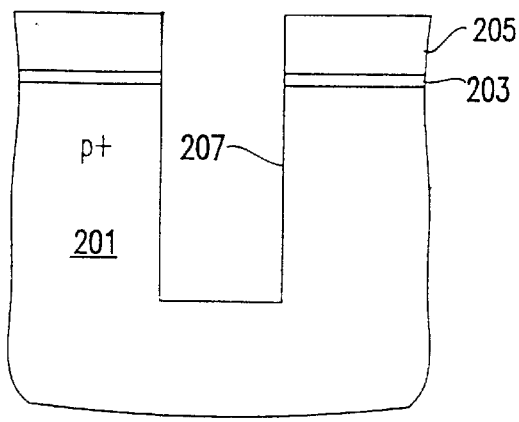
FIGS. 10 through 16 are cross-sectional views of the incentive structure as it is constructed according to a second embodiment of the present invention.

Then, as shown in the step in block 10 of FIG. 1, in the cross-sectional view shown in FIG. 8 and the top view of FIG. 9, pad nitride 51 and pad oxide 53 are stripped. (In FIG. 9, the dashed line 1000 represents the location of the cross-section shown in FIG. 8.) At this point a sacrificial oxide may be grown on the exposed silicon surfaces and channel implants provided to control the threshold voltage of the transistor, provide p or n wells, etc., as described in the '716 patent and as is well know in the art. The sacrificial oxide is then stripped. Next, the gate stack is formed comprising gate dielectric 57 and gate conductor 59 as shown in blocks 11 and 12 and as described in the '716 patent. The multilayer gate stack is then patterned with a mask and etched to provide the gate structure shown in FIG. 8. The etch continues to remove gate dielectric 57 except that which is under gate conductor 59. As shown in the step shown in block 13, nitrite spacers 61 are formed on gate conductor 59 and self-aligned arsenic implants are used to form n- diffusions 63, 63' for the source/drain regions as described in the '716 patent.

Source/drain diffusion 63' extends over and connects with storage trench arsenic doped polysilicon 45 through epitaxial polysilicon 49.

It is seen that, in the present invention deep trench 37 has a dimension that is about equal to that of the minimum photolithographic dimension, a dimension also used for gate 59.

The second embodiment of the present invention is shown in FIG. 1 following solid arrow 200 and in FIGS. 10–17. As can be seen from FIG. 1, many of the steps of this embodiment are similar or the same as previously described. First, as shown in the step in block 1 of FIG. 1 and in the cross-section shown in FIG. 10 substrate 201 is provided, pad oxide 203 is grown, pad nitride 205 deposited and deep trench 207 etched. This is very similar to the cross-sectional view shown in FIG. 2 except that the substrate is a p+ silicon substrate.

Figure 11:
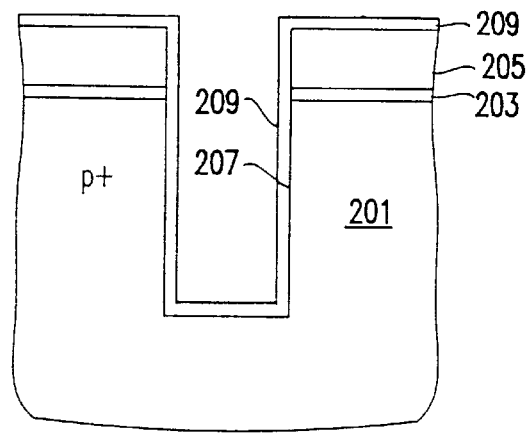

Following the solid arrow 200 in FIG. 1, the next step is shown in block 4 and in the cross-section shown in FIG. 11 where capacitor dielectric 209 is formed on all surfaces of deep trench 207.

Here, the reader will note that no further doping of the substrate surrounding the trench has occurred; a p+ substrate is already sufficiently doped.

Figure 12:
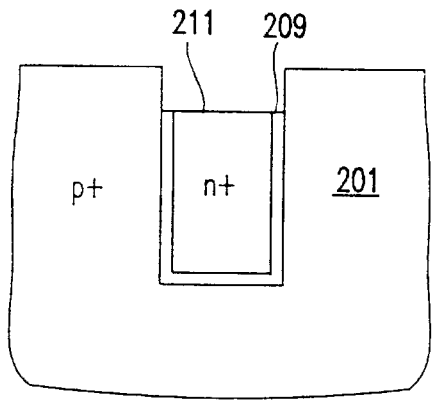

The process continues in FIG. 1 with the steps shown in blocks 5 and 6 and in the cross-sectional view shown in FIG. 12, where trench 207 is filled with arsenic doped n+ polysilicon 211 and recessed, followed by removal of pad nitride 205 and pad oxide 203.

Figure 13:
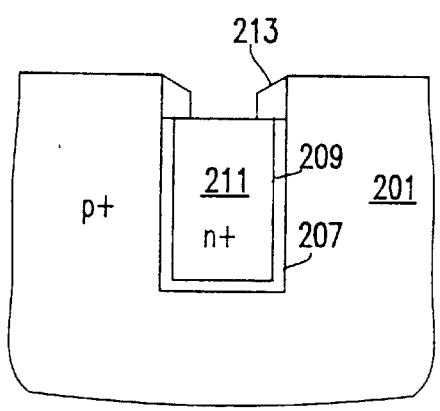

Next, as shown in the step in block 15 of FIG. 1 and in the cross-sectional view in FIG. 13, a dielectric collar 213 is formed by a method such as chemical vapor deposition of a dielectric such as silicon dioxide and spacer etching. Collar 213 will prevent current leakage, such as gate induced drain leakage (GIDL) or substrate trench anomalous breakdown (STAB), and prevent direct contact between p+ substrate 201 and arsenic doped n+ polysilicon 217 provided in the next step (such a collar can also be provided in the first embodiment shown in FIGS. 2–8 to provide additional spacing between n+ diffusion 41 and epitaxial n+ polysilicon 49).

Figure 14:
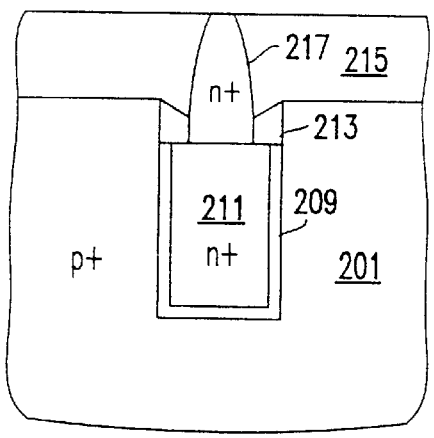

In the next step, as shown in block 7 of FIG. 1 and in the cross sectional view of FIG. 14, p– single crystal silicon 215 is epitaxially grown above p+ substrate 201 and polysilicon 217 is epitaxially grown above arsenic doped polysilicon 211. As was the case with the previous embodiment, arsenic from polysilicon 211 will rapidly diffuse into epitaxially grown polysilicon 217, but will only slowly diffuse into epitaxially grown single crystal silicon 215, providing a junction in single crystal silicon 215. The growth of lightly doped epitaxial silicon on a heavily doped substrate is well known in the art and is described in chapter 2 of *VLSI Technology*, edited by S. M. Sze (McGraw-Hill Book Company, 1983).

Figure 15:
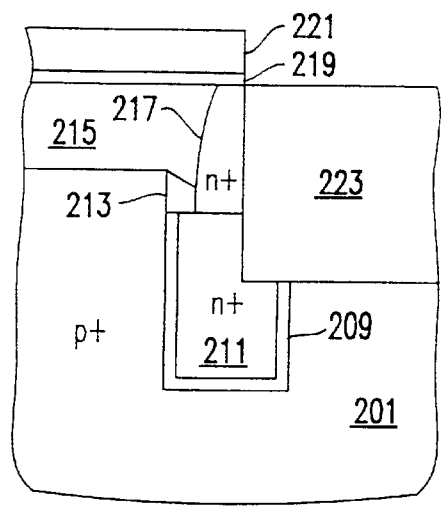

The process then follows the steps shown in block 8 and 9 of FIG. 1 and in the cross-sectional view of FIG. 15, where pad oxide 219 and pad nitride 221 are formed and isolation 223, such as recessed oxide isolation or shallow trench isolation, is formed as described hereinabove.

Figure 16:
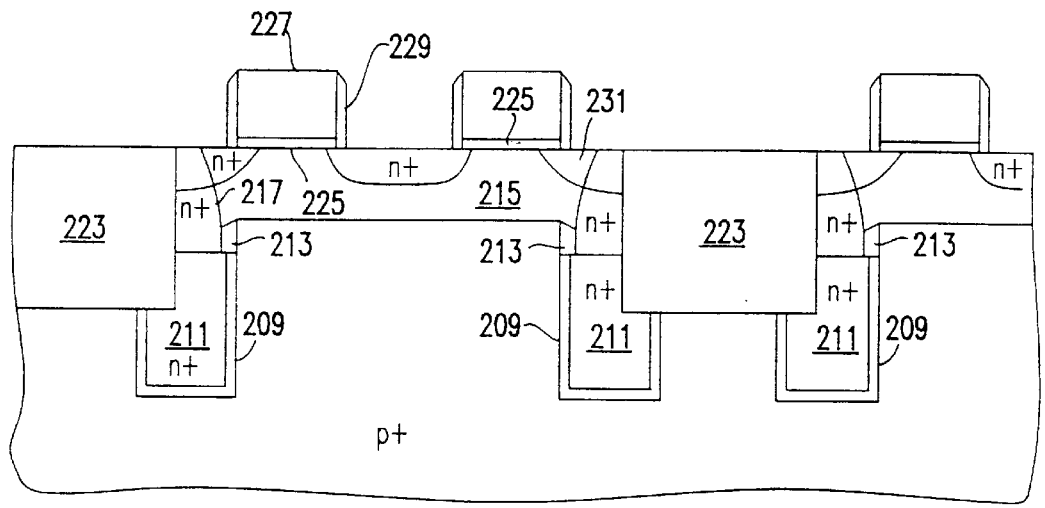
Figure 17:
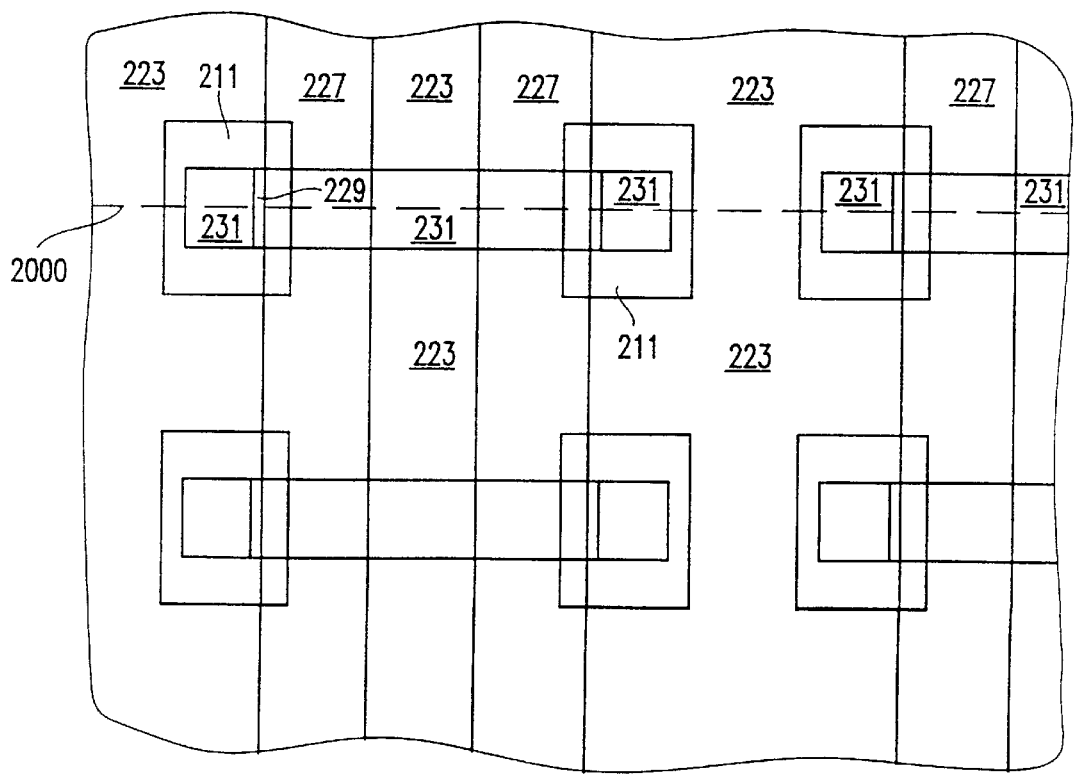
FIG. 17 is a top down view of the inventive structure as it is constructed according to a second embodiment of the present invention.

The final steps are as described for the previous embodiment and are shown in the cross-section in FIG. 16 and in the top view of FIG. 17. In FIG. 17, the dashed line 2000 represents the location of the cross section shown in FIG. 16. As shown in the step in block 10 of FIG. 1, the pad nitride 221 and pad oxide 219 are stripped. Then, as shown in the steps shown in blocks 11 and 12, the gate stack is formed comprising the gate dielectric 225 and gate conductor 227. The multi layer gate stack is patterned with a mask and etched. Following etching, gate dielectric material is removed except that which is under remaining portions of gate conductor 227. As shown in the step shown in block 13, nitride spacers 229 then are formed on gate conductor 227. Finally, arsenic is implanted to form n+ diffusions for the source/drain regions 231. Source/drain diffusion 231 is formed from an n type dopant such as arsenic and provided by a doping technique such as ion implantation. Dopants and techniques for these steps are well known in the art.

The present invention has advantages over the prior art including:

(1) the node diffusion of the transfer device and the strap are located over the trench, saving area calculation shows as a 6.5% savings in cell length compared with a standard cell design;

(2) the node is nevertheless formed in epitaxially single crystal silicon seeded from the single crystal silicon substrate, avoiding leakage;

(3) a separate strap process is avoided since the apitaxial polysilicon for the strap is grown in the same step as the epitaxial single crystal silicon is grown for the transistor;

(4) nearly the full depth of the trench is available for the capacitor since a 1 $\mu$m collar is not needed to avoid a vertical parasitic transistor, here a much shorter collar may be needed (on the order of 0.5 $\mu$m or less);

(5) the space over the trench is used for node diffusion and strap while the trench has a width that is about equal to the minimum dimension achievable with the photolithographic technology used for its fabrication; and (6) while the process adds an epitaxial growth step, the process is simplified in other aspects compared with the prior art. For example, a separate surface strap mask and formation process are eliminated.

While the invention has been described in terms of a two preferred embodiments, those skilled in the art will recognize that the invention can be practiced with modification within the spirit and scope of the appended claims.

We claim:

1. A method of fabricating a semiconductor structure, comprising:

providing a semiconductor substrate;

forming a trench comprising a doped polycrystalline semiconductor electrode in said semiconductor substrate, said trench having two edges;

growing a layer of epitaxial semiconductor above said substrate and above said trench, wherein said layer of epitaxial semiconductor comprises a single crystalline portion and a polycrystalline portion, wherein said polycrystalline portion extends exclusively over said polycrystalline semiconductor electrode in said trench between vertical axes extending from said two edges, and wherein said single crystalline portion extends over a portion of said polycrystalline portion between said vertical axes extending from said two edges;

forming a node diffusion in said layer of epitaxial semiconductor having a first portion formed in an upper region of said polycrystalline portion of said layer and a second portion formed in an upper region of said single crystalline portion of said layer of epitaxial semiconductor which includes said portion which extends over said doped polycrystalline portion; and a gate having a gate edge aligned over one of said two trench edges.

2. A method of fabricating a semiconductor structure comprising:

a) providing a semiconductor substrate;

b) forming a trench comprising a polycrystalline semiconductor electrode, said trench having two edges;

c) growing a layer of epitaxial semiconductor above said substrate and above said trench, wherein said layer of epitaxial semiconductor comprises a single crystalline portion and a polycrystalline portion, wherein said polycrystalline portion extends exclusively over said polycrystalline semiconductor electrode in said trench between vertical axes extending from said two edges, and wherein said single crystalline portion extends over a portion of said polycrystalline portion between said vertical axes extending from said two edges; and d) forming a node diffusion in said layer of epitaxial semiconductor having a first portion formed in an upper region of said polycrystalline portion of said layer of epitaxial semiconductor and a second portion formed in an upper region of said single crystalline portion of said epitaxial layer which includes said portion which extends over said doped polycrystalline portion.

* * * * *